(12) United States Patent
Takano et al.

(10) Patent No.: US 7,184,479 B2
(45) Date of Patent: Feb. 27, 2007

(54) DATA TRANSMISSION METHOD AND DATA TRANSMISSION DEVICE

(75) Inventors: Tomohiro Takano, Kusatsu (JP); Tadashi Sakaguchi, Kusatsu (JP); Hideyuki Azumi, Kusatsu (JP)

(73) Assignee: Daikin Industries, Ltd., Osaka (JP)

( * ) Notice: Subject to any disclaimer, the term of this patent is extended or adjusted under 35 U.S.C. 154(b) by 771 days.

(21) Appl. No.: 10/148,997

(22) PCT Filed: Oct. 29, 2001

(86) PCT No.: PCT/JP01/09479

§ 371 (c)(1),
(2), (4) Date: Jun. 6, 2002

(87) PCT Pub. No.: WO02/37785

PCT Pub. Date: May 10, 2002

(65) Prior Publication Data

US 2002/0181578 A1 Dec. 5, 2002

(30) Foreign Application Priority Data

Oct. 30, 2000 (JP) ............................ 2000-330027

(51) Int. Cl.
*H03K 7/08* (2006.01)
*H03M 5/08* (2006.01)
(52) U.S. Cl. ....................................... 375/238; 341/53
(58) Field of Classification Search ................ 375/238, 375/259; 341/53, 51, 50; 327/172–175, 327/100, 31, 1; 332/106, 109; 370/203–205, 370/212
See application file for complete search history.

(56) References Cited

U.S. PATENT DOCUMENTS 3,766,323 A * 10/1973 Wittman ..................... 327/166

(Continued)

FOREIGN PATENT DOCUMENTS

JP 55-39421 A 3/1980

(Continued)

OTHER PUBLICATIONS

D.J. Lynch, "The suitability of various line coding techniques for the simultaneous transmission of data over copper telephone lines" University of Saskatchewan, Department of Electrical Engineering, Dec. 1997, pp. 12-59, X002213739, Figure 3.2.

*Primary Examiner*—Tesfaldet Bocure
*Assistant Examiner*—Vineeta Panwalkar
(74) *Attorney, Agent, or Firm*—Birch, Stewart, Kolasch & Birch, LLP

(57) ABSTRACT

A data transmission method capable of suppressing communication errors with a simple microcomputer processing is provided. Upon a pulse signal in which specific data is made up of H and L levels, either one of which has a pulse width taken as a first fundamental signal length $T_1$ and the other of which has a pulse width taken as a second fundamental signal length $T_2$ equal to an integer multiple of the first fundamental signal length $T_1$, a correction is performed by increasing or decreasing the second fundamental signal length $T_2$ by a length equal to an integer multiple of a value resulting from dividing the first fundamental signal length $T_1$ of the transmission-side pulse signal by an integer.

4 Claims, 6 Drawing Sheets

U.S. PATENT DOCUMENTS

| | | | | |
|---|---|---|---|---|
| 4,367,414 A | * | 1/1983 | Miller et al. | 307/38 |
| 5,132,957 A | * | 7/1992 | Mashimo | 369/59.2 |
| 5,621,758 A | * | 4/1997 | Suzuki et al. | 375/238 |
| 5,640,160 A | * | 6/1997 | Miwa | 341/53 |
| 6,169,765 B1 | * | 1/2001 | Holcombe | 375/238 |

FOREIGN PATENT DOCUMENTS

| | | |
|---|---|---|
| JP | 57-89360 A | 6/1982 |
| JP | 5-315998 A | 11/1993 |

* cited by examiner

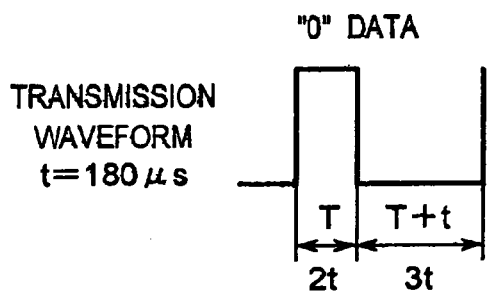
*Fig. 1A*
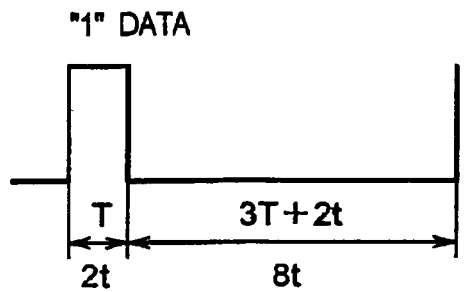
*Fig. 1B*
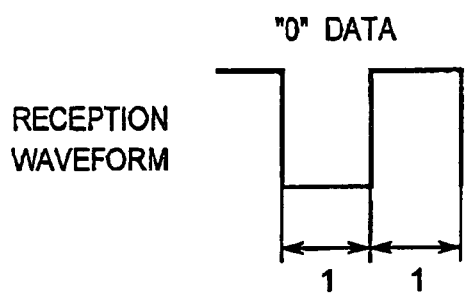
*Fig. 1C*
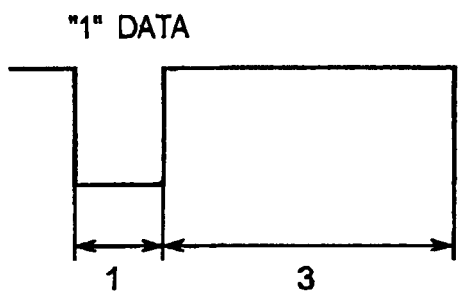
*Fig. 1D*
*Fig. 2* PRIOR ART
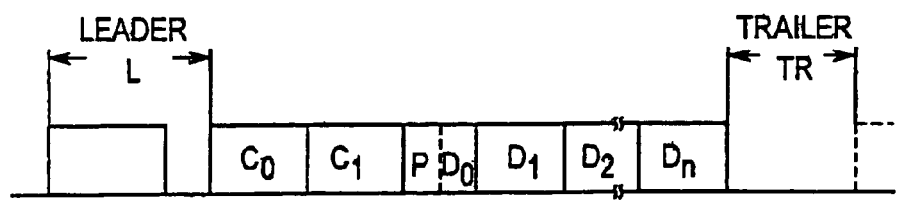

TRANSMISSION WAVEFORM

RECEPTION WAVEFORM

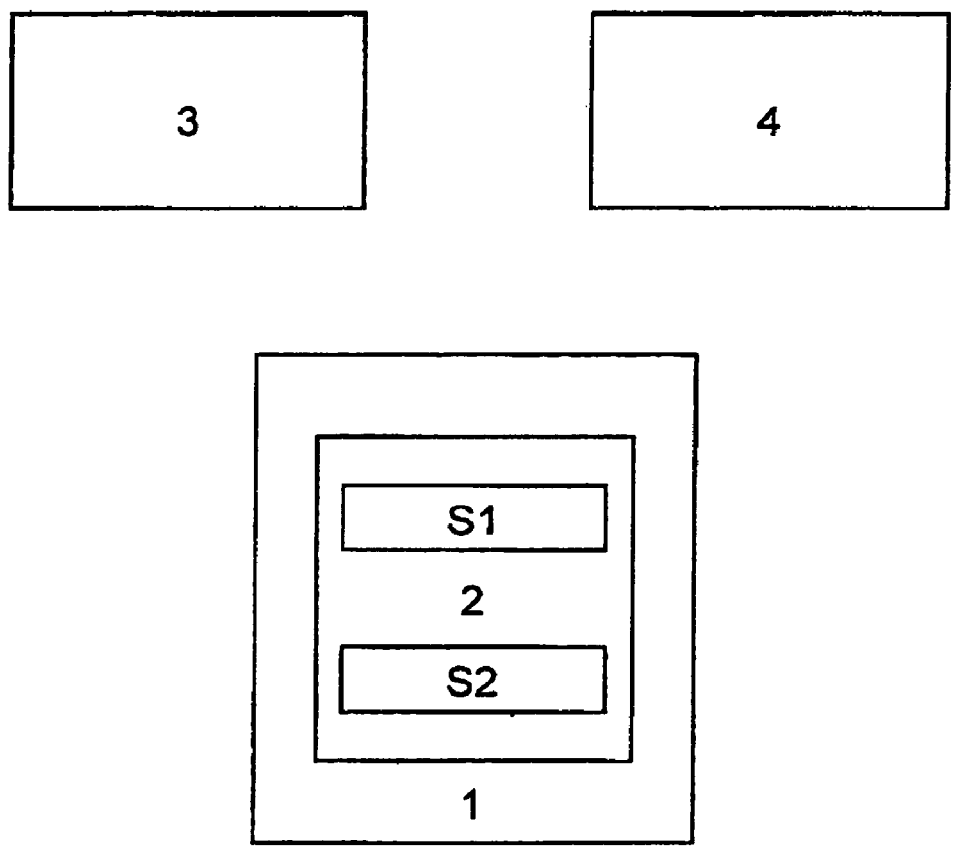

DATA TRANSMISSION METHOD AND DATA TRANSMISSION DEVICE

This application is the national phase under 35 U.S.C. § 371 of PCT International Application No. PCT/JP01/09479 which has an International filing date of Oct. 29, 2001, which designated the United States of America.

TECHNICAL FIELD

The present invention relates to a data transmission method and a data transmission device for constructing specific data by means of the pulse widths of H and L levels.

BACKGROUND ART

Recently, with the spread of electric home appliances equipped with an infrared radiation type wireless remote control (hereinafter, referred to as infrared remote control), there has arisen a problem that products may misidentify other manufacturers' signals or signals derived from other products, resulting in malfunctions. Due to this, the Association for Electric Home Appliances (AEHA) intends to prevent the occurrence of such malfunctions by prescribing a data transmitting signal format for the infrared remote control. The following describes the construction of this signal format defined by the Association for Electric Home Appliances.

FIG. 2 shows the construction of the signal format. As shown in this figure, a signal sequence consists mainly of a leader L indicating the start of the signal sequence, a custom code C($C_0$, $C_1$) identifying the company that supplies the product, a parity P, a data code D($D_1$–$D_n$) indicating specific information to be conveyed and a trailer TR indicating the end of the signal sequence. These are transmitted in this order to execute one control command. Of these signals, FIGS. 3A–3C show the shapes of standardized major pulse signals. That is, FIG. 3A shows the shape of the pulse signal in the leader portion L, FIG. 3B shows the shape of the pulse signal in the data code portion D and FIG. 3C shows the shape of the pulse signal in the trailer portion TR. These signals are constituted by pulses whose widths are integer multiples of a fundamental signal length T. As shown in the figures, a substantially rectangular pulse signal composed of H and L levels is designed to make up specific data depending on the H level pulse width and the L level pulse width so that what signal has been transmitted and received can be discriminated by detecting these pulse widths. Specifically, if a signal is transmitted whose ratio of the H level pulse width to the L level pulse width is 8T: 4T as shown in FIG. 3A, this signal is decided as a leader L indicating the start of the signal sequence. If a signal is transmitted whose H level pulse width is T and whose L level pulse width is 8 ms or longer as shown in FIG. 3C, this signal is decided as a trailer TR indicating the end of the signal sequence.

Meanwhile, the shapes of pulses in the data code portion D indicating the information are dependent on how "0" and "1" data are combined as shown in FIG. 3B. Each of the data is distinguished from the other by H level pulse width and L level pulse width. That is, if the ratio of the H level pulse width to the L level pulse width is T:T (1:1), the received data is recognized as "0" data. If the ratio of the H level pulse width to the L level pulse width is T:3T (1:3), the received data is recognized as "1" data. It is also prescribed that the ratio of the sum of the respective level pulse widths of "0" data to that of "1" data should be 1:2. Further, the fundamental signal length T is prescribed to fall within in the range of T=350 µs–500 µs, 3T=1050 µs–1500 µs).

In this connection, there has been a problem that if the pulse signal of the data code portion D is transmitted as it is in the exact waveform prescribed by the signal format, communication errors tend to occur because the waveform on the reception side is unsharpened on the whole as shown in FIG. 5 depending on the infrared photodetector's characteristics, noise-reducing capacitor and so on, resulting in shifts in the ON/OFF timing of the waveform. More specifically, the waveform recognized by a microcomputer on the reception side is affected by threshold settings, with a tendency that H level pulse widths on the transmission side are recognized longer and L level pulse widths shorter. Therefore, the waveform on the reception side may not satisfy the prescribed requirements of the range of fundamental signal length, T=350 µs–500 µs, and the ratio among the individual pulse widths, as a problem.

It is conceivable to adopt a method in which, as shown in FIGS. 6A–6D, L level pulse widths of a transmission-side waveform are set longer than its H level pulse widths, more specifically, a method in which the L level pulse width is corrected to an integer multiple of the H level pulse width before transmitted. That is, in this method, on the transmission side, the ratio of H level pulse width to L level pulse width for "0" data in the transmission waveform is set to T:2T as shown in FIG. 6A, and the ratio of H level pulse width to L level pulse width for "1" data is set to T:5T as shown in FIG. 6B. As a result of this, on the reception side, the ratio of H level pulse width to L level pulse width for "0" data and "1" data in the reception waveform become generally 1:1 and 1:3, respectively, as shown in FIGS. 6C and 6D. In this case, however, there arises a problem that pulse widths of individual transmission-side data do not meet the standard value range. That is, whereas the standard values for individual data are T=350 µs–500 µs and 3T=1050 µs–1500 µs, such large-scale corrections as correcting T to 2T and correcting 3T to 5T as shown above would cause a problem that the resulting transmission waveform deviates from the above standard value range.

As other countermeasures, there are some other methods in which correction on the reception side is performed not by determining the pulse width with a threshold set at the generally center of the reception-side waveform, but by implementing reception-side correction, for example, by determining the pulse width at the rise and fall edges of the waveform or by making the reception-side sampling interval shorter, or other means. In these methods, however, the waveform itself has been deformed by the influence of noise or the like, posing a problem of being inferior in performance to cases where the correction is performed on the transmission side.

DISCLOSURE OF THE INVENTION

The present invention having been accomplished to solve the above defects of the prior art, an object of the present invention is to provide a data transmission method capable of suppressing communication errors through simple microcomputer processing.

In order to achieve the above object, there is provided a data transmission method in which specific data is made up of H and L levels, either one of which has a pulse width taken as a first fundamental signal length ($T_1$) and the other of which has a pulse width taken as a second fundamental signal length ($T_2$) equal to an integer multiple of the first fundamental signal length ($T_1$), comprising the step of performing a correction of increasing or decreasing the second fundamental signal length ($T_2$) by a length equal to an integer multiple of a value resulting from dividing the first fundamental signal length ($T_1$) of a transmission-side pulse signal by an integer.

In one embodiment of the present invention, the correction is applied to pulse signals of an infrared remote control.

In this data transmission method, a correction is performed by increasing or decreasing the second fundamental signal length by a length equal to an integer multiple of a value resulting from dividing the first fundamental signal length of the transmission-side pulse signal by an integer. This makes it possible to set correction amounts for the lengths of pulse widths of individual signal levels in fine steps. As a result of this, it becomes possible to select correction amounts that allow the standard values for the pulse widths of the individual signal levels to be satisfied. Moreover, since the correction amount for the second fundamental signal length is given by a length equal to an integer multiple of a value resulting from dividing the first fundamental signal length by an integer, microcomputer processing can be simplified.

Also, there is provided a data transmission device in which specific data is made up of H and L levels, either one of which has a pulse width taken as a first fundamental signal length ($T_1$) and the other of which has a pulse width taken as a second fundamental signal length ($T_2$) equal to an integer multiple of the first fundamental signal length ($T_1$), comprising:

division means for determining a value resulting from dividing the first fundamental signal length ($T_1$) of a transmission-side pulse signal by an integer; and correction means for performing a correction of increasing or decreasing the second fundamental signal length ($T_2$) by a length equal to an integer multiple of the value determined by the division means.

In this data transmission device, correction is carried out in the following way. The division means determines a value resulting from dividing the first fundamental signal length of a transmission-side pulse signal by an integer, and the correction means increases or decreases the second fundamental signal length by a length equal to an integer multiple of the value determined by the division means. This makes it possible to set the correction amounts for the lengths of pulse widths in individual signal levels in fine steps. As a result of this, it becomes possible to select correction amounts that allow the standard values for the pulse widths of the individual signal levels to be satisfied. Moreover, since the correction amount for the second fundamental signal length is given by a length equal to an integer multiple of a value resulting from dividing the first fundamental signal length by an integer, the processing of a microcomputer equipped with this data transmission device can be simplified.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein:

FIGS. 1A–1D are schematic diagrams showing the shapes of pulse signal waveforms according to one embodiment of a data transmission method of the present invention;

FIG. 2 is an arrangement diagram of the signal format for explaining the data transmission method;

FIG. 7 is a highly schematic diagram of a remote control device having a microcomputer with a dividing means and a correction means.

BEST MODE FOR CARRYING OUT THE INVENTION

Figure 3A:
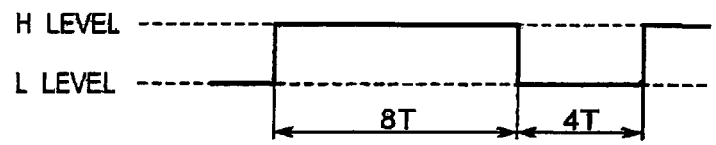
FIGS. 3A–3C are schematic diagrams showing the shapes of various pulse signal waveforms.

A concrete embodiment of the data transmission method of the invention will now be described in detail with reference to the accompanying drawings.

FIGS. 1A–1D are schematic diagrams showing the shapes of pulse signal waveforms according to one embodiment of a data transmission method of the present invention. The constitution of signal format and the standards of various types of signal pulses are generally similar to those of the prior art shown above, and so their description is omitted. It is noted that the data transmission method in this embodiment is applied to data transmission between a microcomputer incorporated in an electric home appliance 3 and an infrared remote control 1.

FIGS. 1A–1D show an example of the case where transmission waveform is corrected so that the reception-side waveform conforms to the standards prescribed by the Association for Electric Home Appliances. FIGS. 1A and 1B show the waveforms of "0" data and "1" data, respectively, derived from an infrared remote control, which is the transmission side. FIGS. 1C and 1D show the waveforms of "0" data and "1" data, respectively, to be recognized by a microcomputer, which is the reception side. This embodiment employs a correction method that the L level pulse width is increased by a length equal to an integer multiple of a value resulting from dividing the H level pulse width on the transmission side by an integer (fundamental unit length t). Hereinbelow, the correction method for "0" data of transmission waveform is explained concretely. First, in the transmission waveform conforming to the standards for "0" data (see FIG. 3B), the H level pulse width is taken as a first fundamental signal length $T_1$ (not shown), and value resulting from dividing this first fundamental signal length $T_1$ by 2 is taken as a fundamental unit length t. Then, a correction is performed by adding this fundamental unit length t to a second fundamental signal length $T_2$ (not shown), which is the L level pulse width, where the result is taken as a new L level pulse width (see FIG. 1A). Since $T_1$ and $T_2$ in the "0" data basically have a relation that $T_1=T_2$, it is assumed that $T_1=T_2=T$. From this relation, the ratio of H level pulse width to L level pulse width in the transmission waveform can be expressed as T:T+t (2t:3t) as shown in FIG. 1A. When this data is transmitted, a waveform in which the ratio of H level pulse width to L level pulse width on the reception side is generally 1:1 as shown in FIG. 1C is obtained.

Similarly, referring to "1" data, in a transmission waveform satisfying the standards for "1" data (see FIG. 3B), the H level pulse width is taken as the first fundamental signal length $T_1$, and a length resulting from dividing this by 2 is taken as the fundamental unit length t. Then, a correction is performed by adding a length 2t, double of this fundamental unit length t, to a second fundamental signal length $T_2$, which is the L level pulse width, where the result is taken as a new L level pulse width (see FIG. 1B). Since $T_1$ and $T_2$ in the "1" data basically have a relation that $3T_1=T_2$, it is assumed that $T_2=3T_1=3T$. From this relation, the ratio of H level pulse width to L level pulse width in the transmission waveform can be expressed as T:3T+2t (2t:8t) as shown in FIG. 1B. When this data is transmitted, a waveform in which the ratio of H level pulse width to L level pulse width on the reception side is generally 1:3 as shown in FIG. 1D is obtained.

Even in the correction of transmission waveform, considerations are given so that the ratio of the sum of individual level pulse widths in "0" data to the sum of individual level pulse widths in "1" data, i.e. (T+T+t):(T+3T+2t) in this case, meets the requirement for the ratio of 1:2.

Next, discussions are made as to whether or not each pulse width of the corrected waveform on the transmission side satisfies the standards prescribed by the Association for Electric Home Appliances. In this connection, since the transmission-side waveform is corrected so that the pulse width of each level in the reception-side waveform has the fundamental signal lengths $T_1$ and $T_2$ falling within the ranges of T=350 μs–500 μs and 3T=1050 μs–1500 μs, respectively, the reception waveform can be said to be compliant to the standard value ranges. Hereinbelow, it is examined whether or not the pulse widths of the corrected individual data on the transmission side fall within the standard value ranges ±10%, that is, the ranges of T=315 μs–550 μs and 3T=945 μs–1650 μs. In this embodiment, as shown in FIGS. 1A and 1B, the L level length of "0" data (second fundamental signal length $T_2$) is corrected to T+t (=3t), and further the L level length of "1" data (second fundamental signal length $T_2$) is corrected to 3T+2t (=8t). Therefore, on the assumption that the fundamental unit length is t=180 μs, substituting this for the above value yields 3t=540 μs and 8t=1440 μs, showing that these pulse width values fall within the standard value ranges ±10%, respectively. Thus, it can be said that the corrected transmission waveform substantially meets the standard value ranges.

As shown above, this embodiment of the data transmission method includes a correction that the second fundamental signal length $T_2$, which is the L level pulse width, is increased by a length equal to an integer multiple of a value t resulting from dividing the first fundamental signal length $T_1$, which is the H level pulse width, by an integer on the transmission side. As a result, correction amounts for the lengths of pulse widths can be set in finer steps than the conventional method where the pulse width of one level is set to an integer multiple of that of the other level. Thus, it becomes possible to select, from among the individual correction amounts derived by the above-described method, such appropriate correction amounts that both transmission- and reception-side pulse widths meet the standard value ranges. In addition, since the degree of freedom for noise reducing measures on the reception side is enhanced by virtue of the implementation that signals substantially conforming to the standard values can be transmitted and received as described above, it becomes possible to provide a capacitor having a large noise reducing effect or the like. Further, since mis-recognition of signals becomes less likely to occur, the communication error rate can be lowered. Furthermore, since the correction amount for the second fundamental signal length $T_2$ is given by a length equal to an integer multiple of a value resulting from dividing the first fundamental signal length $T_1$ by an integer, microcomputer processing can be simplified.

Figure 4:
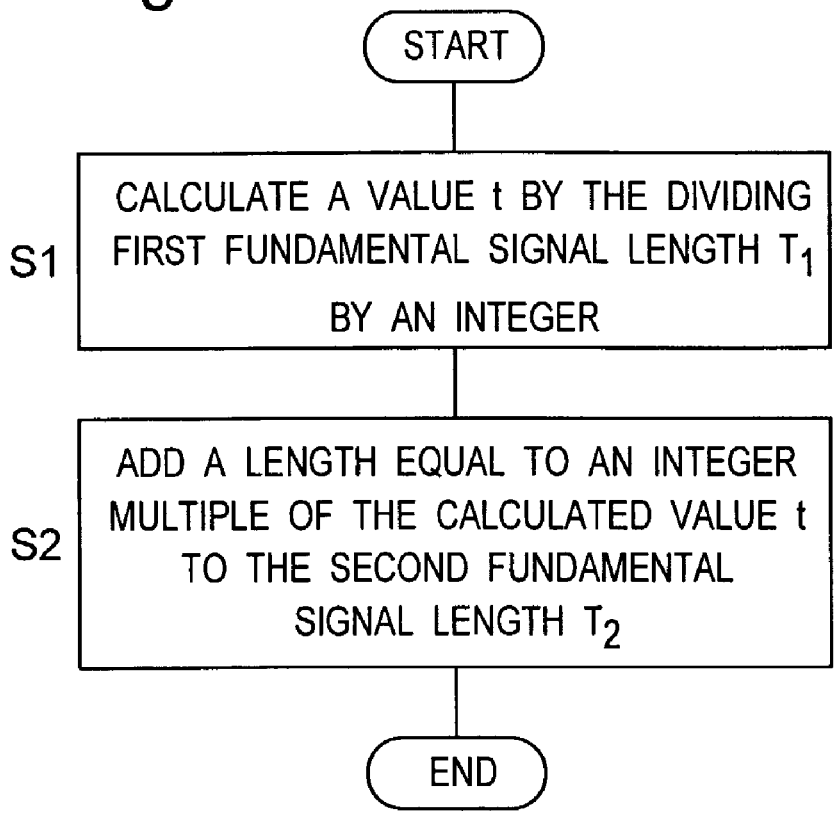
FIG. 4 is a flow chart showing the flow of transmitting-signal processing according to an embodiment of the data transmission device of the present invention.
Figure 5:
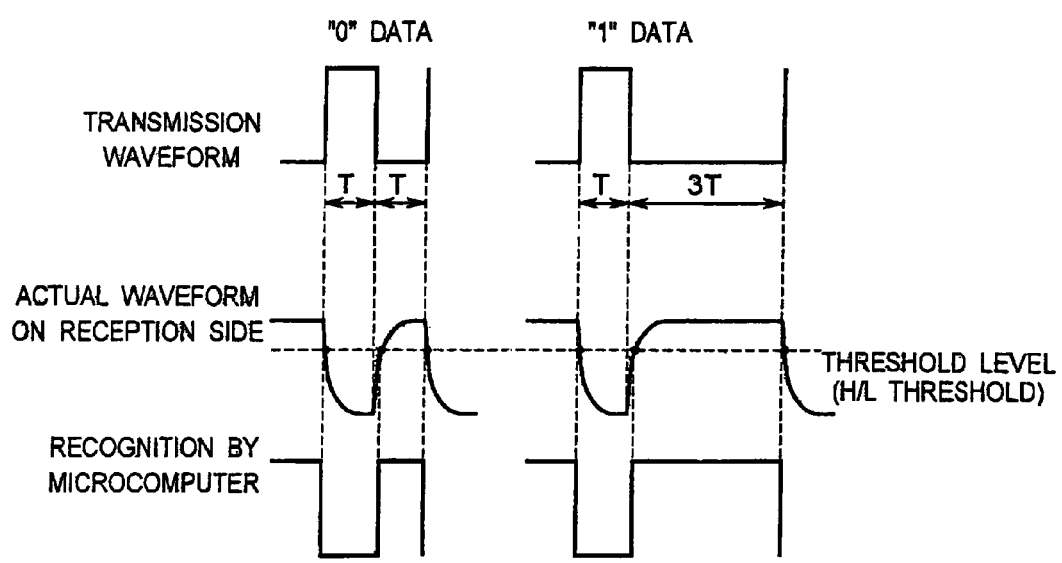
FIG. 5 is an explanatory view showing a data transmission method according to the prior art.
Figure 6A:
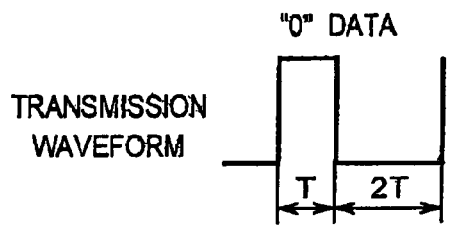
FIGS. 6A–6D are explanatory views showing a data transmission method according to the prior art.
Figure 6B:
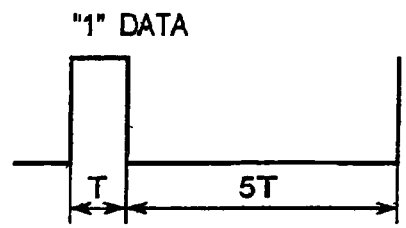
Figure 6C:
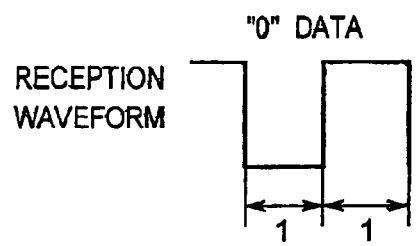
Figure 6D:
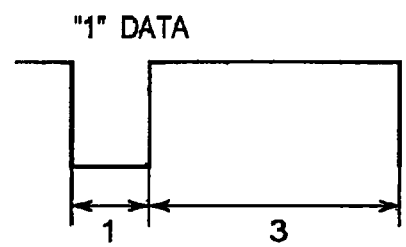

FIG. 4 shows the flow of transmitting-signal processing according to an embodiment of the data transmission device of the present invention. This data transmission device transmits data by a pulse signal having an H level width of a first fundamental signal length $T_1$ and an L level width of a second fundamental signal length $T_2$ (e.g., $T_2=T_1$ for "0" data, $T_2=3 T_1$ for "1"data) which is an integral multiple of the first fundamental signal length $T_1$. This data transmission device processes pulse signals of data code $D_1, D_2, \ldots D_n$ portions in FIG. 2 in a fashion shown in FIG. 4 and transmits them, while signals of the other portions in FIG. 2, i.e. leader L, custom codes $C_0$, $C_1$, parity P and trailer TR, are the same as in FIG. 2. A microcomputer 2 within the remote control 1, which is shown in FIG. 7, includes division means S1 for determining a value resulting from dividing the first fundamental signal length $T_1$ of a transmitting pulse signal by an integer, and correction means S2 for performing a correction of increasing the second fundamental signal length $T_2$ by a length equal to an integer multiple of the value determined by the division means S1.

At step S1 in FIG. 4, the division means divides the first fundamental signal length $T_1$, which is the H level width of the pulse signal to be transmitted, by an integer (e.g., 2), calculating a value t (=$T_1$/2). Then at step S2 in FIG. 4, the correction means adds an integer multiple (e.g., 1 for "0" data, 2 for "1" data) of the calculated value t to the second fundamental signal length $T_2$ (e.g., $T_1$ for "0" data, $3T_1$ for "1" data), which is the L level width of the pulse signal to be transmitted. Thus, for example, with the resulting ratio of the H level pulse width to the L level pulse width being $(T_1):(T_1+t)$ for "0" data or $(T_1):(3T_1+2t)$ for "1" data, the pulse signal representing data is transmitted to the reception side (see FIG. 1A).

Figure 3B:
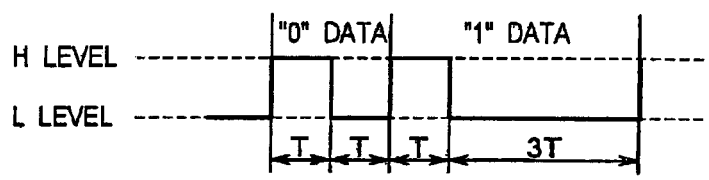
Figure 3C:
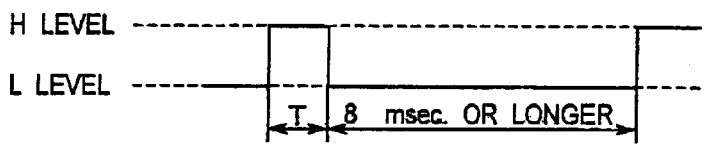

The pulse signal sent out from the data transmission device is received by the reception side as a pulse signal whose ratio of H level pulse width to L level pulse width is generally 1:1 for "0" data or generally 1:3 for "1" data as described in conjunction with FIGS. 1A and 3B for an embodiment of the data transmission method of the invention. Accordingly, each of the H and L level pulse widths conforms to the standards prescribed by the Association for Electric Home Appliances on both transmission and reception sides, exerting the same working effects as in the already described data transmission method.

Although concrete embodiments of the data transmission method and the data transmission device of the present invention have been described hereinabove, the invention is not limited to these embodiments. Instead, the invention can be carried out with various alterations within the scope of the invention. For example, although the above embodiments include a correction that the second fundamental signal length $T_2$, which is the L level pulse width, is increased by a length equal to an integer multiple of a value t resulting from dividing the first fundamental signal length $T_1$, which is the H level pulse width of the transmission waveform, by an integer, it is also possible to perform a reverse correction that the second fundamental signal length $T_2$ is decreased by a length equal to an integer multiple of the fundamental unit t. Further, although the above embodiments include the setting that the first fundamental signal length $T_1$ is assigned to the H level width and the second fundamental signal length $T_2$ to the L level width, yet the above correction method may also be applied on the setting that, reverse to the above embodiments, the first fundamental signal length $T_1$ is assigned to the L level width and the second fundamental signal length $T_2$ to the H level for signals in which the H level width is an integer multiple of the L level width. Further, although the above embodiments have been exemplified by a correction that the pulse width ratio for "0" data of transmission waveform is corrected to T:T+t (2t:3t) and the pulse width ratio for "1" data is corrected to T:3T+2t (2t:8t), yet the invention is not limited to this combination of ratios and various correction amounts may be selected so that the prescribed standard values are met, for example, by dividing the first fundamental signal length $T_1$ by 4 (T=4t) and setting the ratio to T:T+2t (4t:6t) for "0" data and T:3T+4t (4t:16t) for "1" data. Further, although the correction of transmission waveform has been done so as to satisfy the standards prescribed by the Association for Electric Home Appliances in the above cases, yet correction amounts may also be determined so as to satisfy other standard prescriptions. Further, although the above embodiment has been described on a transmission method with an infrared remote control, the invention method may also be applied to transmission methods with a wired remote control or the like. Further, although the above embodiments have been described on a method in which the transmitted waveform is inverted on the reception side, that is, a method in which the waveform is received with the H level taken as the L level and with the L level taken as the H level, the invention method is also applicable to methods involving no inversion of waveform, that is, methods in which the waveform is received with the H level taken as the H level and with the L level taken as the L level, in the same way as in the above case.

According to the data transmission method and the data transmission device of the invention, since the correction amounts for the lengths of pulse widths of signal levels can be set in fine steps, it becomes possible to select correction amounts that meet the standard values of pulse widths of individual signal levels. Furthermore, since the correction amount for the second fundamental signal length is set to a length equal to an integer multiple of a value resulting from dividing the first fundamental signal length by an integer, the microcomputer processing can be simplified.

In addition, according to the present invention, since there is no need for using any plurality of timers, a low-priced microcomputer will do for implementing the invention.

INDUSTRIAL APPLICABILITY

The data transmission method and the data transmission device of the present invention can be applied to not only electric home appliances 3 but also air conditioners 4.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A data transmission method in which specific data is made up of H and L levels, either one of which has a pulse width taken as a first fundamental signal length (T1) and the other of which has a pulse width taken as a second fundamental signal length (T2) equal to an integer multiple of the first fundamental signal length (T1), comprising:
    dividing the first fundamental signal length (T1) of transmission-side pulse signal by an integer to obtain a value; and
    correcting the specific data pulse width on the transmission side hy increasing or decreasing the second fundamental signal length (T2) by a length equal to an integer multiple of the obtained value;
    so that the correction cause the first and second fundamental signal lengths of both the transmission-side and reception-side to fall within a prescribed range of a standard value.

2. The data transmission method according to claim 1, wherein
    the specific data comprises pulse signals of an infrared remote control.

3. A data transmission device in which specific data is made up of H and L levels, either one of which has a pulse width taken as a first fundamental signal length (T1) and the other of which has a pulse width taken as a second fundamental signal length (T2) equal to an integer multiple of the first fundamental signal length (T1), comprising:
    division means for determining a value resulting from dividing the first fundamental signal length (T1) of a transmission-side pulse signal by an integer; and
    correction means for performing a correction of increasing or decreasing the second fundamental signal length (T2) by a length equal to an integer multiple of the value determined by the division means; whereby
    the correction causes the first and second fundamental signal lengths of both the transmission-side and the reception-side to fall within a prescribed range of a standard value.

4. The data transmission method according to claim 1, wherein the integer, which divides the first fundamental signal length (T1) of the transmission-side pulse signal, is 2.

* * * * *